United States Patent

Niehaus et al.

[11] 4,300,148
[45] Nov. 10, 1981

[54] SEMICONDUCTOR DEVICE GATE-DRAIN CONFIGURATION

[75] Inventors: William C. Niehaus, New Providence; Stuart H. Wemple, Chatham, both of N.J.

[73] Assignee: Bell Telephone Laboratories, Incorporated, Murray Hill, N.J.

[21] Appl. No.: 65,526

[22] Filed: Aug. 10, 1979

[51] Int. Cl.³ .............................................. H01L 29/48
[52] U.S. Cl. ...................................... 357/15; 357/22; 357/52; 357/55; 357/90
[58] Field of Search ...................... 357/15, 22, 55, 52, 357/90

[56] References Cited

U.S. PATENT DOCUMENTS 3,767,984 10/1973 Shinoda et al. ...................... 357/90

OTHER PUBLICATIONS

IEEE Trans. Elec. Dev.-vol.-ED-23, No. 4, Apr. 1976, pp. 388-394, Fukuta et al.
IEEE Trans. on Microwave Theory & Tech.-vol. MTT-27, No. 5, May 1979, Di Lorenzo et al., pp. 367-378.
IEDM Tech. Digest., Dec. 1978, pp.364-367, Eastman.
Wiley, Interscience, 1969, p. 411, SZE.
Bell Lab. Record, Sep. 1978, pp. 209-215, Di Lorenzo et al.
IEEE Trans. on Microwave Theory & Tech.-vol. MTT-24, Jun. 1976, Fukuta et al., pp. 312-317.
Inst. Phys. Conf., Ser. No. 33B, 1977, pp. 262-270, Wemple et al.

*Primary Examiner*—Edward J. Wojciechowicz
*Attorney, Agent, or Firm*—Peter A. Businger

[57] ABSTRACT

Power handling capability and gain of metal-semiconductor field effect devices is adversely affected by a phenomenon variously known as gate-drain avalanche or gate breakdown which occurs at elevated gate-drain voltage. Consequently, it is desirable to design devices so as to maximize gate-drain breakdown voltage $V_{gd}$ consistent with maximum output power capability.

According to the invention, such voltage is maximized by a gate-drain configuration which involves approximate equalization of per-unit-area mobile charge in a portion of the active layer under the gate contact and in an adjoining portion between gate and drain contacts. Equalization of charge may be achieved by appropriate doping or appropriate choice of layer thickness, either alone or in combination. In particular, if dopant concentration per unit volume is essentially equal in the two portions, approximate equalization of conducting channel thickness in the two portions is called for. Devices of the invention are capable of higher gain and output power as is desirable in applications such as, e.g., the amplification of microwaves.

6 Claims, 2 Drawing Figures

SEMICONDUCTOR DEVICE GATE-DRAIN CONFIGURATION

TECHNICAL FIELD

The invention is concerned with semiconductor devices.

BACKGROUND OF THE INVENTION

Semiconductor devices are commercially well established as active components in computing and communication equipment where they may serve, e.g., as gates and switches and as sources, modulators, and amplifiers of radio frequency electromagnetic radiation. Semiconductor devices are being developed also for serving similar functions in optical communications as exemplified by devices such as laser diodes and phototransistors described in the book by A. A. Bergh et al., *Light Emitting Diodes*, Clarendon Press, 1976.

Among semiconductor devices for radio frequency application are devices generally known as metal-semiconductor field effect transistors (MESFETs for short) which are being used, e.g., as microwave amplifiers on account of their capability to operate at relatively high frequencies and power levels and to generate low noise output. A basic MESFET structure is described in the book by S. M. Sze, *Physics of Semiconductor Devices*, Wiley-Interscience, 1969 where, on p. 411, a device is shown to encompass a semi-insulating substrate on which an n-type semiconducting epitaxial layer is deposited. Three contacts are deposited on the semiconducting layer, namely a first ohmic contact acting as a negative or grounded source contact, a metal-semiconductor Schottky barrier contact acting as a gate contact, and a second ohmic contact acting as a positive drain contact. A device structure is disclosed also on p. 211 of the paper by J. V. DiLorenzo et al., "GaAs+-FET = Improved Microwave Systems", *Bell Laboratories Record*, September 1978, pp. 209–215. Devices disclosed by DiLorenzo exhibit a gate electrode which is disposed in a notched portion of the active layer.

Design of MESFETs is aimed at the realization of a number of desirable device features such as, e.g., maximization of gain and output power. In this respect, various impediments have been described in the literature among which are, e.g., effects known as source-drain burnout and gate breakdown. Burnout, in particular, is addressed by M. Fukuta et al., "Power GaAs MESFET with a High Drain-Source Breakdown Voltage", *IEEE Transactions on Microwave Theory and Techniques*, Vol. MTT-24, No. 6, June 1976, pp. 312–317 and by S. H. Wemple et al., "Source-Drain Burn-Out in GaAs MESFETs", *Inst. Phys. Conf.*, Ser. No. 33B, 1977, pp. 262–270. A device design for minimizing burnout is disclosed in pending U.S. patent application Ser. No. 921,585, filed July 3, 1978, in the names of W. C. Niehaus and S. H. Wemple.

Gate breakdown, also known as gate-drain avalanche, is disclosed, e.g., in the paper by M. Fukuta et al. cited above; the paper by M. Fukuta et al., "GaAs Microwave Power FET", *IEEE Transactions on Electron Devices*, Vol. ED-23, No. 4, April 1976, pp. 388–394; and by J. V. DiLorenzo et al., *IEEE Transactions*, Vol. MTT-27 (1979). Gate breakdown occurs at a characteristic gate-drain voltage $V_{gd}$ and is manifested by excess drain current which cannot be modulated by the gate. Since, in the interest of gain and output power capability of devices, elevated gate-drain operating voltages are desirable, means are sought to optimize breakdown voltage $V_{gd}$.

SUMMARY OF THE INVENTION

The invention is a metal-semiconductor field effect device which is designed to have elevated gate breakdown voltage consistent with maximum output power capability. Such voltage is maximized by a gate-drain configuration which involves approximate equalization of per-unit-area mobile charge in a portion of the active layer under the gate contact and in an adjoining portion, here designated "output space", between gate and drain contacts. Equilization of per-unit-area mobile charge may be achieved by appropriate doping or appropriate choice of layer thickness, either alone or in combination. In particular, if dopant concentration per unit volume is essentially equal in the two portions, equalization of conducting channel thickness is called for so as to result, when the gate is forward biased, in a conducting channel having approximately the same thickness under the gate contact as in the portion of the active layer between gate contact and drain contact. Ratio of a per-unit-area mobile charge in the output space to per-unit-area mobile charge in the portion of the active layer under the gate contact is chosen in a preferred range of from 0.7 to 1.1.

DETAILED DESCRIPTION

Metal-semiconductor field effect devices comprise an active layer of a semiconductor material which is supported by a substrate and which has extrinsic properties due to net doping with an appropriate free carrier n-or p-type impurity. A drain contact is on a portion of the active layer and a Schottky barrier gate contact is on another portion of the active layer. A buffer layer may typically be interposed between substrate and active layer. Wherever the active layer is not in contact with an ohmic contact layer, a surface depletion region devoid of free carriers is present.

Figure 1:
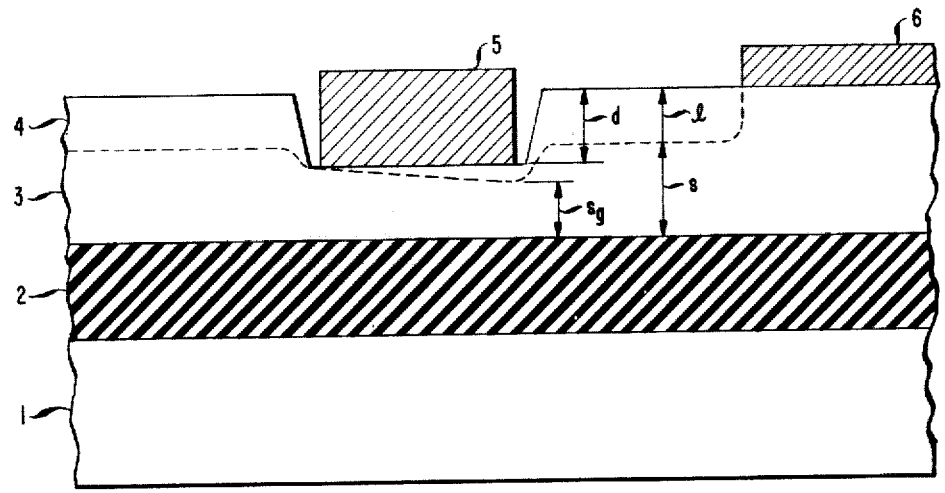
FIG. 1 shows schematically and in cross section a prior art field effect device.
Figure 2:
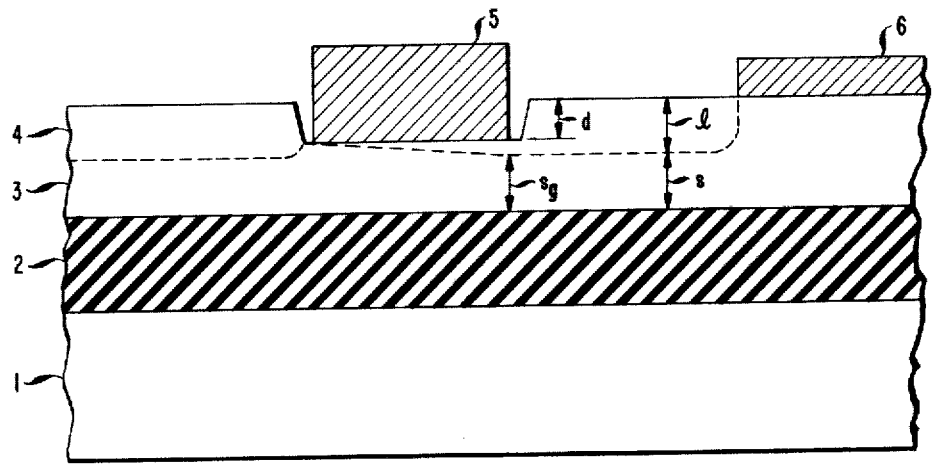
FIG. 2 shows schematically and in cross section a field effect device according to the invention.

FIGS. 1 and 2 show such device structure and, in particular, substrate 1, buffer layer 2, active layer 3 with surface depletion region 4, Schottky barrier gate contact 5 disposed in a notched portion of active layer 3, and drain contact 6. Devices may also comprise a source contact on the active layer. Drain contact configuration in n- or p-type devices may optionally comprise a more heavily doped $n^+$- or $p^+$- region, respectively, which may preferably be as disclosed in patent application Ser. No. 921,585 cited above. Devices are shown forward biased, i.e., having minimum thickness of depletion region 4 under gate contact 5 and, in consequence, having maximum conducting channel thickness $s_g$ under gate contact 5.

Maximization of breakdown voltage according to the invention calls for approximate equalization of charge per unit area in two adjoining portions of active layer 3. Specifically, in the interest of maximization of gate breakdown voltage consistent with maximum output power capability, the ratio between charge per unit area in the output space between gate contact 5 and drain contact 6 to charge per unit area in the portion underlying gate contact 5 may preferably not exceed a value of 1.1. Also, in the interest of minimization of pinch-off voltage, such ratio is preferably not less than 0.7. A more narrow preferred range for this ratio is 0.8 to 1.0.

If doping per unit volume is essentially uniform in the active layer, stated preferred conditions are realized by approximate equalization of conducting channel thickness under the gate contact and in the output space. This is illustrated by a device cross section according to FIG. 2 which, in contrast to FIG. 1, shows thickness $s_g$ to be approximately equal to thickness s. Such equalization is the result of a choice of notch depth d somewhat less than thickness 1 of surface depletion layer 4 gate contact 5 and drain contact 6.

Maximization of gate breakdown voltage according to the invention may alternately be effected by appropriate choice of dopant concentrations in an active layer having constant thickness. Also within the scope of the invention are appropriate combinations of a notched design with a difference in dopant concentration.

Substrate, buffer layer, and active layer may be made, e.g., of appropriately doped GaAs or other III-V material. Specifically, substrate 1 is preferably doped with a dopant such as, e.g., Cr so as to result in a resistivity not less than approximately $10^7$ ohm cm. Buffer layer 2, if present, is required to have substantially greater sheet resistivity than layer 3. Layer 3 may consist of GaAs, doped lightly with an appropriate impurity such as, e.g., S, Se, or Sn and preferably so as to result in a net dopant concentration of $10^{16}$ to $3 \times 10^{17}$ per $cm^3$. Ohmic contact 6 may be a layer of Ag-Au-Ge, Ni-Au-Ge, or any other suitable ohmic contact material. Gate contact 5 consists of a suitable gate metal such as, e.g., aluminum.

Typical MESFET dimensions are a substrate thickness of 1-4 mils, a buffer layer thickness of 2-15 micrometers, an n- or p-layer thickness of 0.2-0.7 micrometers, an ohmic contact thickness of 0.5-5 micrometers, and a gate contact thickness of 0.5-1.5 micrometers.

The structure shown in FIG. 2 may be conveniently produced, e.g., on a gold plated sheet of copper which acts as a heat sink during device operation. Deposition of layers of doped and undoped semiconductor material may conveniently be accomplished by well-known techniques such as chemical vapor deposition, liquid phase epitaxy, molecular beam epitaxy, and ion implantation, either alone or in combination. Metallic layers are typically deposited by evaporation.

Desired thickness of active layer 3 is conveniently achieved by etching, interrupted periodically to permit current measurement upon application of a known fixed voltage applied to a source electrode and drain electrode 6. Alternatively, current may be monitored while etching is in progress, etching being continued until a desired current per unit channel width is measured. Similarly etching a gate notch having desired depth d may proceed until a second desired current per unit channel width is measured.

Effectiveness of the new gate design is exemplified by gate breakdown voltages $V_{gd}$ in excess of 50 volts as measured for GaAs MESFETs having dopant concentration $N = 5 \times 10^{16}/cm^3$ in the active layer and having constant conducting channel thickness $s = s_g = 0.35$ micrometer. By contrast, a prior art MESFET having the same dopant concentration, having $s_g = 0.25$ micrometer, but having $s = 0.5$ micrometer was measured to have $V_{gd} = 20$ volts, i.e., significantly less than the value of $V_{gd}$ in excess of 50 volts for devices according to the invention.

EXAMPLE

Sulfur doped GaAs MESFETs were fabricated by chemical vapor deposition in a quartz tube on a chromium doped GaAs substrate. Arsenic trichloride gas was passed through the tube in which the substrate was placed downstream of a boat carrying metallic gallium. The substrate was maintained at a temperature of 700 degrees C and the boat at a temperature of 800 degrees C. A mixture of hydrogen and hydrogen sulfide gases was leaked into the tube at a point between the boat and the substrate. Differentiation between buffer layer and n- layer was effected during deposition by simple adjustment of the leak valve. Deposition proceeded at a nominally constant rate of approximately 0.2 micrometers per minute. Nominal layer thickness for buffer and active layers as deposited was 3.0 and 0.8 micrometers, respectively. Nominal dopant concentration for the active layer was $5 \times 10^{16}$ per $cm^3$. A mesa structure was produced by etching, and Au-Ge-Ag source and drain contacts were deposited 8 micrometers apart by a standard lithographic lift-off technique. The substrate was heated to render source and drain contacts ohmic by alloying. The active layer between source and drain contacts was etched to a nominal thickness of 0.6 micrometer, periodic current measurements being used to infer thickness as described above. A mask was applied for etching a notch 2 micrometers long in which the Al gate contact layer was formed by evaporation and standard lithographic lift-off processing. A mask was deposited leaving only metallic contact areas exposed to allow thickening with Ti-Pt-Au to lower current density in source and drain contacts and to facilitate bonding of wire leads.

We claim:

1. Metal-semiconductor field effect device comprising a substrate, an active layer which is epitaxially deposited on said substrate and which is doped with at least one significant free carrier impurity, a metal-semiconductor Schottky barrier gate contact on a first portion of said active layer, a drain contact on a second portion of said active layer, said second portion of said active layer being disposed relative to said first portion of said active layer so as to allow for a third portion of said active layer, said third portion being the portion of said layer which is intermediate to said first portion and said second portion, said third portion here being designated output space, said device being CHARACTERIZED IN THAT per-unit-area concentration of free carriers in said output space is in the range of 0.7 to 1.1 times per-unit-area concentration of free carriers in said first portion.

2. Device of claim 1 in which per-unit-volume concentrations of free carriers in said first portion and said third portion are approximately equal and in which thickness (s) of a conducting channel in said output space is in the range of 0.7 to 1.1 times thickness ($s_g$) of a conducting channel in said first portion.

3. Device of claim 1 in which said range is from 0.8-1.0.

4. Device of claim 1 in which the material of said layer is a III-V compound.

5. Device of claim 4 in which said compound is gallium arsenide.

6. Device of claim 1 in which said active layer is n-type.

* * * * *